US006043570A

United States Patent [19]

Kurata et al.

[11] Patent Number: 6,043,570

[45] Date of Patent: Mar. 28, 2000

[54] DRIVING CIRCUIT FOR CAPACITIVE LOAD

[75] Inventors: Takatsugu Kurata, Ibaraki; Kiyoshi Hamada, Sakai; Makoto Kawachi, Ibaraki, all of Japan

[73] Assignee: Matsushita Electronics Corporation, Takatsuki, Japan

[21] Appl. No.: 09/248,475

[22] Filed: Feb. 11, 1999

[30] Foreign Application Priority Data

Feb. 17, 1998 [JP] Japan .................................. 10-035150

[51] Int. Cl.[7] .................................................. H03K 17/00

[52] U.S. Cl. ............................ 307/109; 327/111; 345/211

[58] Field of Search ............................ 307/109; 327/111, 327/108; 345/211; 348/380

[56] References Cited

U.S. PATENT DOCUMENTS

| | | | |
|---|---|---|---|
| 3,656,004 | 4/1972 | Kemerer et al. | 327/111 |
| 4,767,959 | 8/1988 | Sakakibara et al. | 310/317 |
| 5,006,739 | 4/1991 | Kimura et al. | 327/111 |
| 5,731,722 | 3/1998 | Sugiki et al. | 327/111 |
| 5,852,426 | 12/1998 | Erhart et al. | 345/211 |

FOREIGN PATENT DOCUMENTS

| | | |
|---|---|---|
| 0389251 A1 | 9/1990 | European Pat. Off. . |
| 0756190 A1 | 1/1997 | European Pat. Off. . |
| 01296543 | 11/1989 | Japan . |

*Primary Examiner*—Albert W. Paladini
*Attorney, Agent, or Firm*—Rosenthal & Osha LLP

[57] ABSTRACT

A driving circuit for a capacitive load includes an amplifier for applying voltage with large amplitude to the capacitive load in order to reduce the power consumption of the amplifier is disclosed. The driving circuit for the capacitive load applies the voltages Vout, Vout' amplified by a first amplifier and a second amplifier $Q_2$, $Q_3$, $Q_2'$, $Q_3'$ to a first capacitive load C, and a second capacitive load C'. The applied voltages Vout and Vout' have the opposite phase to each other. The driving circuit for the capacitive load includes a first emitter follower circuit $Q_1$ and a second emitter follower circuit $Q_1'$ for converting the supplied voltage Vcc from the power supply source of the driving circuit to the voltage which is higher by predetermined voltages $E_1$, $E_1'$ than the output voltage Vout, Vout' of the first amplifier and the second amplifier respectively. The driving circuit for the capacitive load includes a switching part using diodes $D_1$ and $D_2$ ($D_1'$ and $D_2'$) for switching automatically to connect the power supply terminal of the first amplifier (second amplifier) with either the output of the emitter follower circuit $Q_1$ ($Q_1'$) or the second capacitive load C (the first capacitive load C').

4 Claims, 7 Drawing Sheets

DRIVING CIRCUIT FOR CAPACITIVE LOAD

BACKGROUND OF THE INVENTION

1. Field of the Invention

The present invention relates to a driving circuit including plural amplifier for applying a variable voltage signal to plural capacitive loads respectively in such case as applying driving signal to plural electrodes of a display apparatus.

2. Description of the Related Art

There is a plane type cathode ray tube display apparatus as one example of the display apparatus employing a driving circuit including plural amplifier for applying a variable voltage signal to plural capacitive loads respectively. As shown in FIG. 5, this display apparatus comprises plural electrodes arranged as layers in the vacuum container (the vacuum container is not drawn in FIG. 5). In FIG. 5, there are a back plate 1, a liner cathode 2 as an electron beam source, an electron beam attracting electrode 3, an electron beam control electrode 4, a horizontal deflection electrode 5, a vertical deflection electrode 6, and a screen board 7 sequentially arranged from the rear side of the display apparatus to the front screen side.

Each liner cathode 2 as the electron beam source is installed in a horizontal direction and the plural number (19 for instance) liner cathode 2 are arrayed in the vertical direction by the predetermined intervals (for instance, 4.4 mm). Seven liner cathodes 2*a* to 2*g* are shown in the figure in FIG. 5 for instance. Each liner cathode 2 emits an electron beam which is distributed in a horizontal line. The electron beams are emitted sequentially during predetermined time (8H) beginning from the top liner cathode 2*a* and shifting to down to the next liner cathode in order as shown in FIG. 6. In FIG. 6, the electron beam discharge period corresponds to the period when the liner cathode driving pulse is at a L level.

The back plate 1 makes the electron beam emitted from the liner cathode go to the anode side (viewer side) by applying a negative DC voltage, and suppresses the generation of the electron beam from the liner cathodes except for the liner cathodes presently driving.

Through-holes 10 are horizontally formed with a predetermined pitch at the position opposing to the corresponding liner cathodes 2*a* to 2*g* of the electron beam attracting electrode 3. By applying positive DC voltage to the electron beam attracting electrode 3, the electron beam emitted from the liner cathode 2 are accelerated, and the electron beam is drawn out through the through hole 10.

The Electron beam control electrode 4 includes plural conductive plate 13 (for instance 114) arrayed in a vertical direction with predetermined pitch, where each conductive plate is arranged in a horizontal direction as shown in FIG. 5. For instance, only eight conductive plates 13 are shown in FIG. 5. Through holes 12 are formed in the electron beam control electrode 4 corresponding to the through hole 10 in the electron beam attracting electrode 3. The electron beam control electrode 4 controls the amount of the electron beam flow according to the picture signal, which electron beam is drawn out through the through hole 10 installed in the electron beam attracting electrode 3 by applying voltage corresponding to the picture signal.

The horizontal deflection electrode 5 consists of plural conductive plates whose shape is long in the vertical direction, and which are installed in the position sandwiching the electron beam passing through the through hole 12 of the electron beam control electrode 4 alternately. Plural pairs of conductive plates 14 and 14' are arrayed in the horizontal direction according to the predetermined horizontal pitch of the through hole 12 of the electron beam control electrode 4. Horizontal deflection voltage h and h' (about 100 Vpp) which varies step-wise with the opposite phase as shown in FIG. 6 are applied to the pair of conductive plates 14 and 14'. The electron beam corresponding to each pixel is horizontally scanned and focused onto 3 color fluorescent elements R, G, B in the fluorescent layer which is formed on the screen 7 for luminescent. For instance, by horizontal scanning, one electron beam can control luminescent of two sets of 3 fluorescent elements.

The vertical deflection electrodes 6 are the conductive plates whose shape is long in the horizontal direction, and which are installed in the position sandwiching the electron beam passing through the through hole 12 of the electron beam control electrode 4 alternately. Plural pairs of conductive plate 15 and 15' are arrayed in the vertical direction according to the predetermined vertical pitch of the through hole 12 of the electron beam control electrode 4. Each conductive plate is arrayed by predetermined pitch in the vertical direction. Vertical deflection voltage V and V' (about 350 Vpp) which varies step-wise with the opposite phase as shown in FIG. 6 is applied to the pair of conductive plates 15 and 15'. The electron beam is deflected (scanned) by the vertical deflection voltage. For instance, one electron beam can control 12 lines of fluorescent elements by the vertical scanning. 20 conductive plates can compose 19 pairs of conductive plates corresponding to the 19 liner cathodes. Therefore, 228 lines of horizontal scanning line can be displayed on the screen 7.

Screen 7 is composed of glass plate. Fluorescent elements are coated onto the back plane of the screen 7. Each fluorescent element R, G, B is coated as slender stripe shape in the vertical direction sequentially to the horizontal direction. High voltage (about 10 kV) is applied to the screen 7. In FIG. 5, horizontal broken line drawn on the screen 7 shows the division of the vertical direction corresponding to plural liner cathodes 2, and vertical broken line drawn on the screen 7 shows the division of horizontal direction corresponding to plural electron beam control electrodes 4.

In the above mentioned embodiment of the display apparatus, both deflection voltage, the horizontal deflection voltage h, h') which is applied to a pair of conductive plates 14 and 14' composing the horizontal deflection electrodes, and the vertical deflection voltage (v, v') which is applied to a pair of conductive plates 15 and 15' composing the vertical deflection electrodes, are obtained by amplifying small voltage signal Vin to Vout by a transistor amplifier as shown in FIG. 7.

Regarding the horizontal deflection electrode and the vertical deflection electrode in the above-mentioned structure of display apparatus, it is difficult to reduce the capacitance of these electrodes. In order to apply the voltage signal which varies with large amplitude to a such capacitive load, the voltage signal has been amplified with the above-mentioned amplifier. However, the electric power consumption for the amplifying becomes large. For instance, this large electric power consumption will be a problem especially when driving the display apparatus in the portable equipment by battery.

SUMMARY OF THE INVENTION

Therefore, with the foregoing in mind, it is an object of the present invention to provide a driving circuit for capacitive load for reducing power consumption in order to apply voltage signal with large amplitude to the capacitive load.

In order to achieve the objects, a driving circuit for capacitive load includes plural capacitive loads, plural amplifiers corresponding to the plural capacitive load for amplifying voltage signal and supplying the amplified voltage signal to the corresponding plural capacitive load respectively. A charge accumulated in one capacitive loads is used as an electric power supply source for another amplifier which is not the corresponding amplifier for the capacitive load.

According to this embodiment, the discharge of the charge accumulated in the capacitive load and the charge of other capacitive loads will be performed complementary. Therefore, the entire electric power necessary for driving the plural capacitive loads can be reduced.

Next, the driving circuit for a capacitive load preferably further includes a switching part for switching the power supply source. The switching part selects a charge accumulated in another capacitive load as the power supply source in a predetermined period, and a power supply source of the driving circuit is used as the power supply source in another period.

Next, as a concrete embodiment, the plural capacitive load preferably includes a first capacitive load and a second capacitive load. The plural amplifier preferably includes a first amplifier and a second amplifier, wherein the voltage waveforms which vary by the opposite phase to each other, amplified by the first and second amplifier, are applied to the first and second capacitive loads respectively. The switching part selects the charge accumulated in the second capacitive load as a power supply source for the first amplifier during the period when the voltage of the first capacitive load is lower than that of the second capacitive load, in addition the voltage of the first capacitive load is rising and the voltage of the second capacitive load is at descending. While, the switching part selects the power supply source of the driving circuit as the power supply source for the first amplifier during other period.

Next, the driving circuit for capacitive load preferably further includes a first emitter follower circuit and a second emitter follower circuit for converting the voltage supplied from the supply voltage of the driving circuit to the voltage which is higher by a predetermined voltage than the output voltage of the first and the second amplifier, wherein the terminal of the power supply source of the first amplifier is connected to either the output of the emitter follower or the second capacitive load by the switching part using a diode.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention of the driving circuit for capacitive load will be described by way of embodiments with reference to the accompanying drawings.

Embodiment 1

Figure 1:
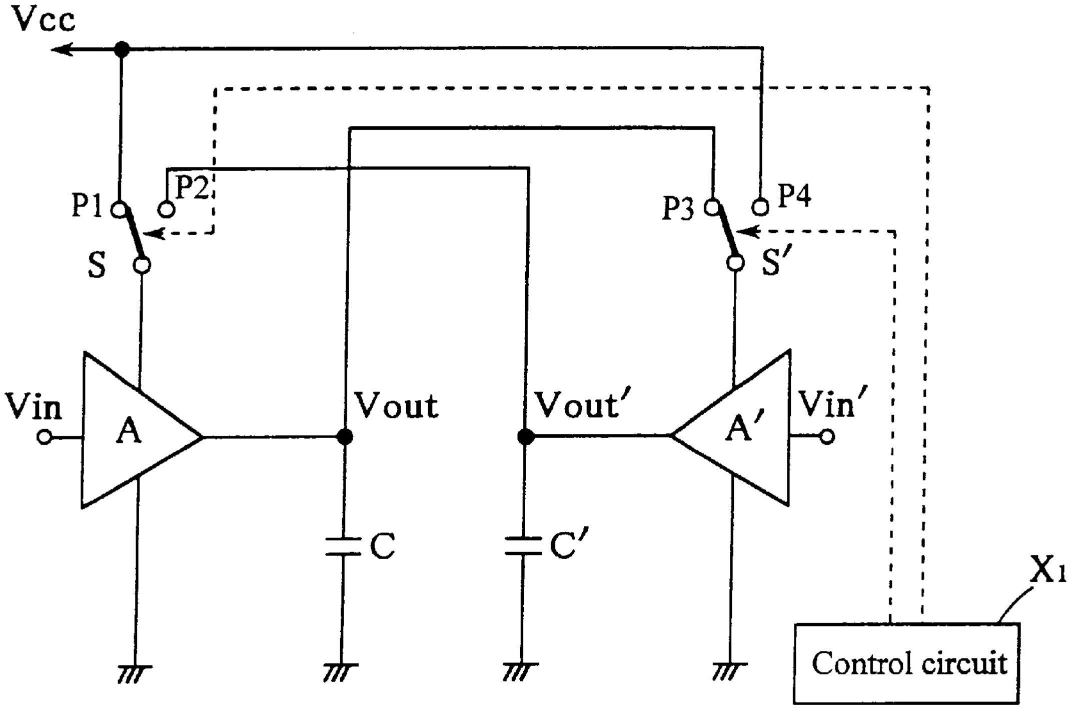
FIG. 1 is a schematic circuit diagram showing a driving circuit for capacitive load according to Embodiment 1 of the present invention.
Figure 5:
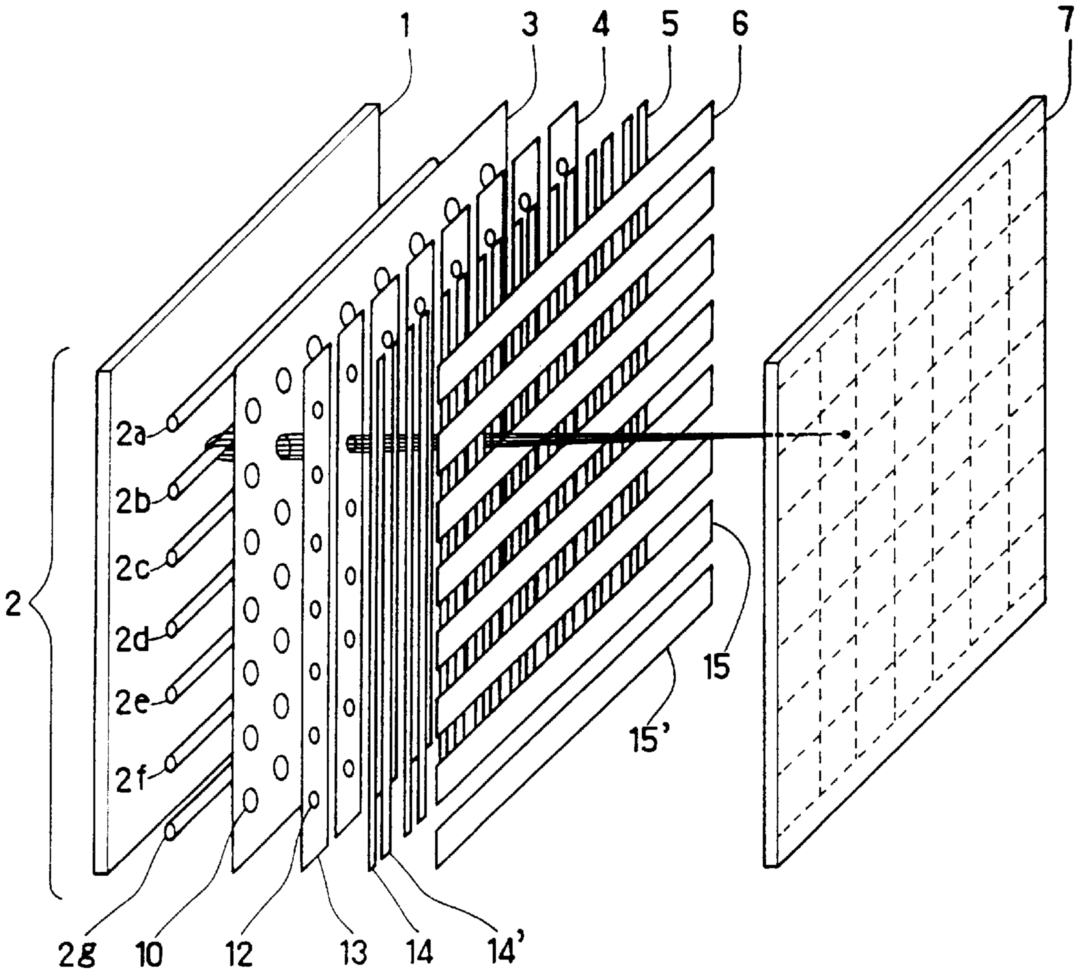
(PRIOR ART) Fig.5
FIG. 5 is an exploded view diagram showing the structure of the internal electrodes in the display apparatus using the conventional driving circuit for capacitive load.

FIG. 1 is a schematic circuit diagram showing a driving circuit for a capacitive load according to Embodiment 1 of the present invention. In FIG. 1, C indicates a first capacitive load and C' indicates a second capacitive load respectively. These corresponds to a pair of conductive plates (15 and 15' shown in FIG. 5) composing the vertical deflection electrodes of the display apparatus. The function of those plates are described in the description of the prior art. A indicates a first amplifier and A' indicates a second amplifier. A and A' output the output signal Vout and Vout' applied to the capacitive load C and C' by amplifying the first and second input signal Vin and Vin' independently. S indicates a first switch and S' indicates a second switch. S and S' corresponds to a switching part for switching the power supply of the first amplifier A and the second amplifier A'. The first contact point P1 of the first switch S is connected with the power supply Vcc of the driving circuit, and the second contact point P2 is connected with the second capacitive load C' and the output part of the second amplifier A'. The first contact point P3 of the second switch S' is connected with the first capacitive load C and the output part of the amplifier A, and the second contact point P4 is connected with a power supply Vcc of the driving circuit.

Regarding the first and second switch S and S', each contact point is switched by the control signal from the control circuit $X_1$. The switching at the contact point is performed by the following processes.

Figure 2:
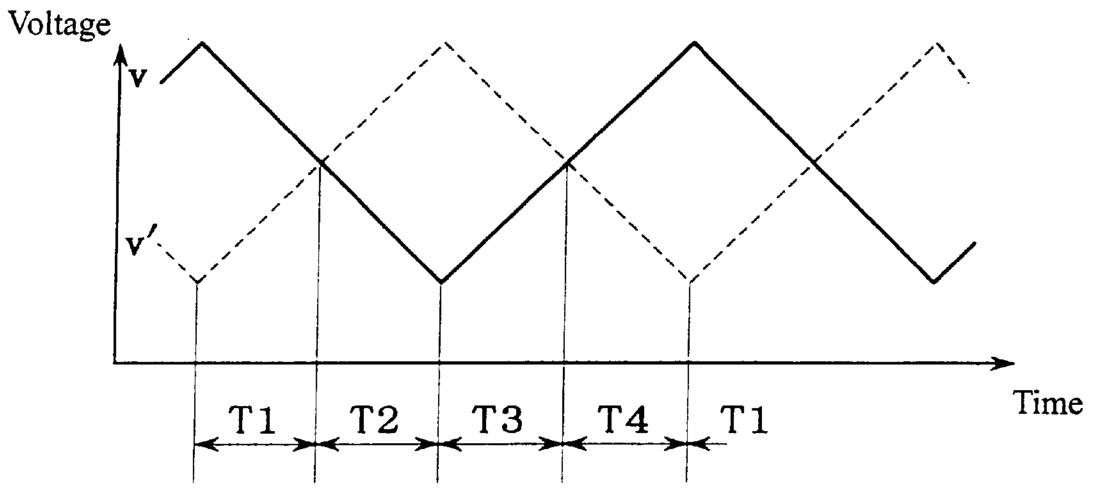
FIG. 2 is a schematic diagram showing a variation of the voltage applied to the capacitive load of the driving circuit shown in FIG. 1.

FIG. 2 is a schematic diagram showing a variation of the voltage (v, v') applied to the capacitive load (C, C') of the driving circuit. The voltage v is equal to the output voltage Vout of the first amplifier A, and voltage v' is equal to the output voltage Vout' of the second amplifier A' shown in FIG. 1.

Figure 6:
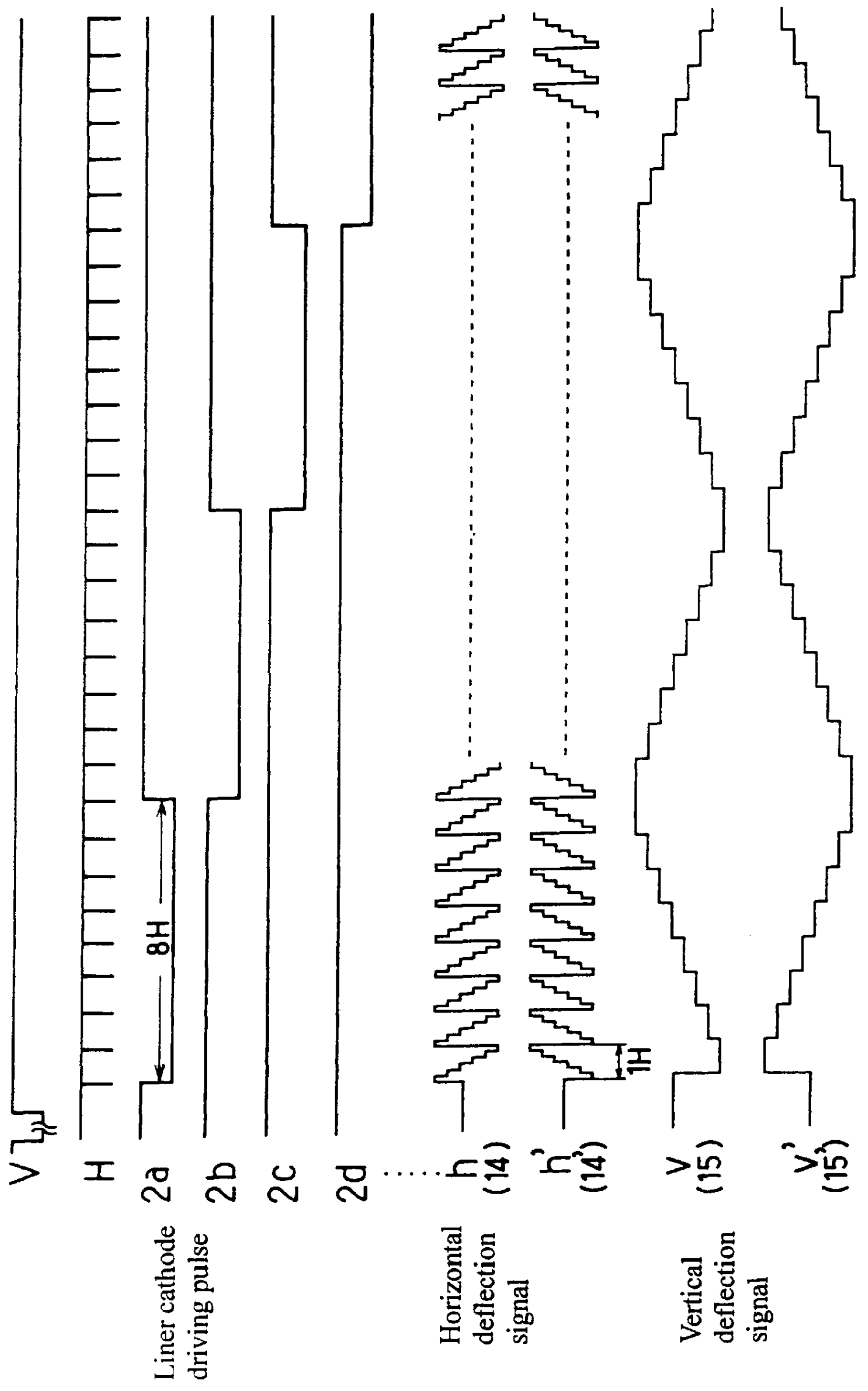
(PRIOR ART) Fig.6
FIG. 6 is a schematic diagram showing a voltage waveform applied to each electrode of the display apparatus shown in FIG. 5.
Figure 7:
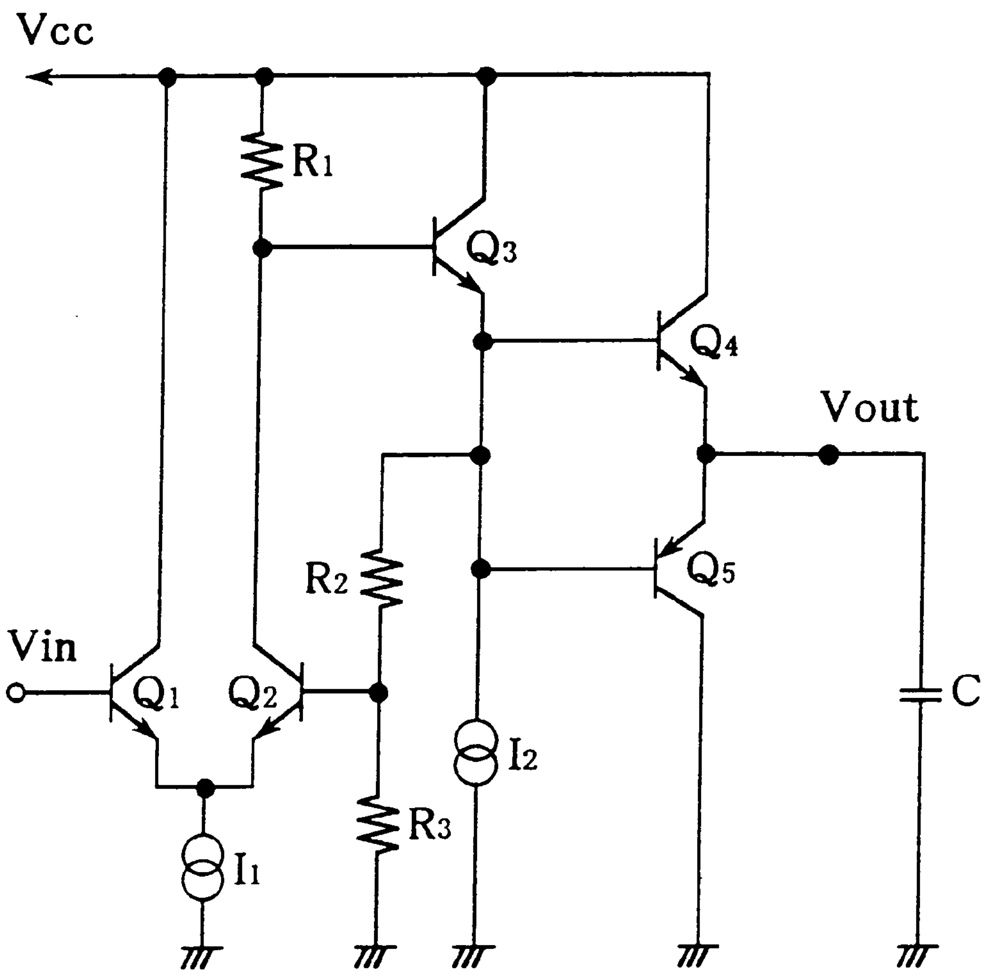
(PRIOR ART) Fig. 7
FIG. 7 is a schematic circuit diagram showing a conventional driving circuit for capacitive load.

In FIG. 2, the voltage v and v' are assumed as a triangular wave which varies monotonously for considering the description convenience. However, the voltage v and v' in practical use have step-wise varied triangular wave and are applied to the conductive plate composing the vertical deflection electrode shown as FIG. 6.

In FIG. 2, the voltage v of the first capacitive load C is higher than voltage v' of the second capacitive load C' during the period T1. The voltage v descends, and voltage v' rises. As for the first switch S, the first contact point P1 is selected in this period as shown in FIG. 1. The power supply Vcc of the driving circuit is connected as an electric power supply source for the first amplifier A. As for the second switch S', the first contact point P3 is selected, and the first capacitive load C is connected as an electric power supply source of the second amplifier A'. As a result, the charge of the first capacitive load C is transferred via the power supply line of the second amplifier A' to the second capacitive load C' through the output terminal. As shown above, the voltage v of the first capacitive load C descends, and voltage v' of the second capacitive load C' rises.

Next, in the period T2 shown in FIG. 2, the voltage v of the first capacitive load C has been lowered to less than the voltage v' of the second capacitive load C'. In this period, the second switch S' is switched to the second contact point P4, and the power supply Vcc of the driving circuit is connected as an electric power supply source for the second amplifier A'. As a result, the voltage v' of the second capacitive load C' keeps on rising. On the other hand, the voltage v of the first capacitive load C keeps on descending.

Next, in the period T3 shown in FIG. 2, the voltage v of the first capacitive load C becomes smaller than the lowest value and turns for rising. The voltage v' of the second capacitive load C' becomes greater than the maximum value and turns for descending. In this period, the first switch S is switched to the second contact point P2 side, and the second capacitive load C' is connected as an electric power supply source of the first amplifier A. As a result, the charge of the second capacitive load C' is transferred via the power supply line of the first amplifier A to the first capacitive load C through the output terminal. As shown above, the voltage v' of the second capacitive load C' descends, and the voltage v of the first capacitive load C rises.

Next, in the period T4 shown in FIG. 2, the voltage v of the first capacitive load C rises and becomes greater than the voltage v' of the second capacitive load C' which is descending. Therefore, the first switch S is switched to the first contact point P1. As a result, the power supply Vcc of the driving circuit is connected as an electric power supply source for the first amplifier A, and the voltage v of the first capacitive load C can keep on rising further. On the other hand, the voltage v' of the second capacitive load C' keeps on descending further.

As mentioned above, control circuit $X_1$ repeats the switch control of the first and second switch for period T1 to T4. Because the electric power of the amplifier is connected with the capacitive load for which voltage is rising in the above-mentioned way can be supplied as the charge of the other capacitive load for which voltage is descending during period T1 and T3, power consumption can be reduced greatly.

Embodiment 2

Figure 3:
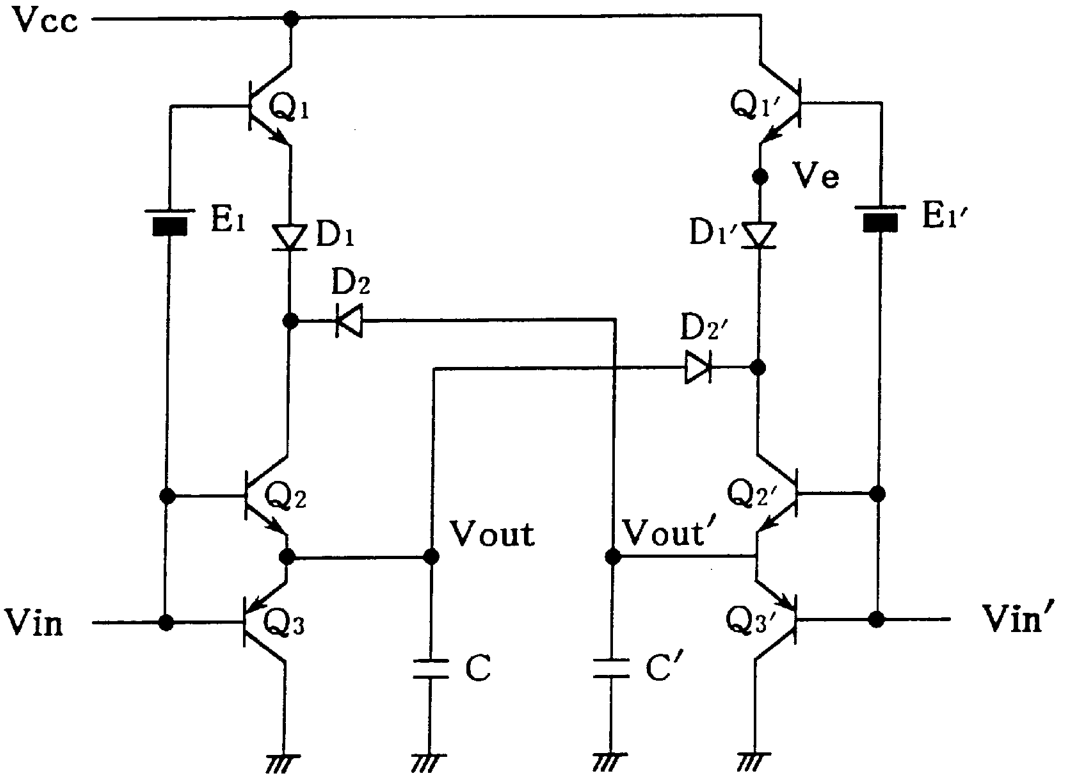
FIG. 3 is a schematic circuit diagram showing a driving circuit for capacitive load according to Embodiment 2 of the present invention.

FIG. 3 is a schematic circuit diagram showing a driving circuit for capacitive load according to Embodiment 2 of the present invention. The driving circuit of this Embodiment 2 is used in order to apply voltage signals having opposite phase to a pair of capacitive load C and C' that are the same as in the first Embodiment shown by FIG. 1.

In this FIG. 3, the same number is assigned to the same element in FIG. 1. $Q_1$ to $Q_3$ and $Q_1'$ to $Q_3'$ are transistors. $D_1$, $D_2$, $D_1'$, and $D_2'$ are diodes. $E_1$ and $E_1'$ are the bias power supply sources.

Transistor $Q_2$ and $Q_3$ ($Q_2'$ and $Q_3'$) compose the current amplifier for amplifying the current of the input signal Vin (Vin'). The bias power supply source $E_1$ ($E_1'$) supplies voltage which is always higher $E_1$ ($E_1'$) volt than the input signal voltage Vin (Vin') to the base terminal of the transistor $Q_1$ ($Q_1'$) for the electric power supply. The potential of the emitter of the transistor $Q_1$ ($Q_1'$) varies according to the input signal voltage Vin' (Vin) which is the output voltage Vout' (Vout).

Figure 4:
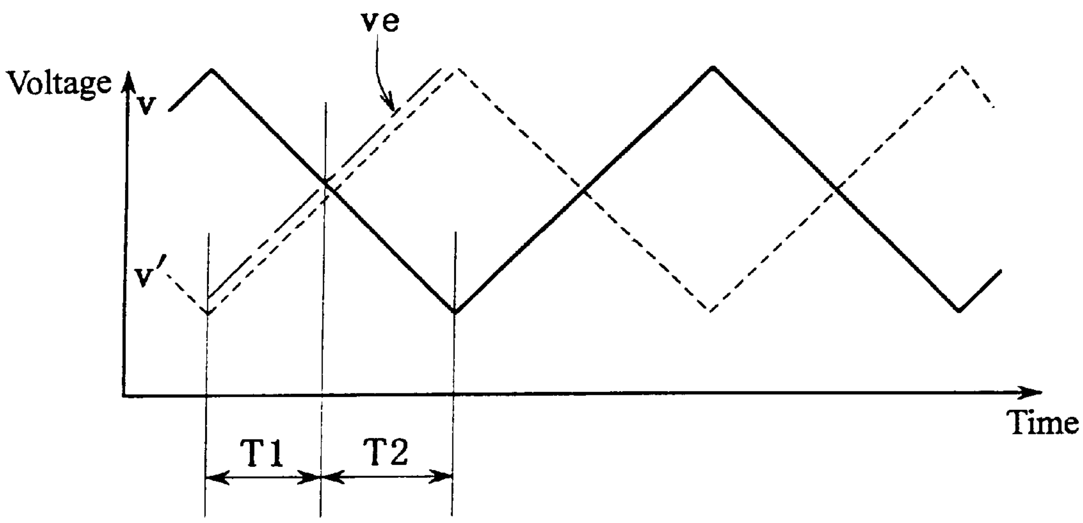
FIG. 4 is a schematic diagram showing a variation of the voltage applied to the capacitive load of the driving circuit shown in FIG. 3.

Diode $D_1$ and $D_2$ ($D_1'$ and $D_2'$) function as a switch to switch the power supply source for the current amplifier which is composed of the transistors $Q_2$ and $Q_3$ ($Q_2'$ and $Q_3'$). The function will be described as follows. FIG. 4 shows a variation of the voltage applied to the capacitive load of the driving circuit. Voltage v is equal to the output voltage Vout of the first amplifier which is composed of the transistor $Q_2$ and $Q_3$ shown in FIG. 2. Voltage v' is equal to the output voltage Vout' of the second amplifier which is composed of the transistor $Q_2'$ and $Q_3'$.

In FIG. 2, the voltage v and v' are assumed as a triangular wave which varies monotonously for description convenience. However, the voltage v and v' in practical use have step-wise varied triangular wave and are applied to the conductive plate composing the vertical deflection electrode shown as FIG. 6. Alternate long and short dash line ve in FIG. 4 indicates the variation of the voltage of the emitter terminal of the electric power supply transistor $Q_1'$ shown in FIG. 3.

During T1 period shown in FIG. 4, the diode $D_2'$ turns on and the charge of the first capacitive load C is transferred to the second capacitive load C' through the diode $D_2'$ and the transistor $Q_2'$.

In short, the first capacitive load C is connected as a power supply source for the second amplifier which is composed of the transistors $Q_2'$ and $Q_3'$. At this time, Diode $D_1'$ turns to the cut-off status because of reverse bias, and the electric power supply to the second amplifier from the power supply Vcc of the driving circuit is shut off.

During period T2 shown in FIG. 4, the Diode $D_1'$ turns on, and the Diode $D_2'$ turns off.

As a result, the power supply Vcc of the driving circuit is connected as an electric power supply source for the second amplifier which is composed of the transistors $Q_2'$ and $Q_3'$. Therefore, an electric power is supplied from Vcc to the second capacitive load C' through the transistor $Q_1'$, diode $D_1'$ and transistor $Q_2'$.

Regarding the electric power supply source of the first amplifier which is composed of the transistors $Q_2$ and $Q_3$ for applying the first capacitive load C, the switching control will be performed in the same manner as the above mentioned electric power supply source of the second amplifier.

In short, during the period T3, the electric power is supplied from the second capacitive load C', and at period T4, the electric power is supplied from power supply Vcc of the driving circuit.

Thus, the power supply source for the current amplifier composed of transistors $Q_2$ and $Q_3$ ($Q_2'$ and $Q_3'$) is automatically switched sequentially by the switching operation of the diodes $D_1$ and $D_2$ ($D_1'$ and $D_2'$. In this Embodiment 2, the same as Embodiment 1, because the electric power of the amplifier connected with the capacitive load whose voltage is rising in the above-mentioned way can be supplied as the charge of the other capacitive load whose voltage is at descending during period T1 and T3, the power consumption can be reduced greatly.

When the set voltage of the electrode bias power supply sources $E_1$ and $E_1'$ are too high, the period T1 becomes short and the effect of the power reduction becomes small. However, there is no problem in practical use if the electrode bias power supply voltage is set as several volt level range.

As described above, the driving circuit for the capacitive load of the present invention can reduce the power consumption greatly by utilizing the charge accumulated in the capacitive load to drive other capacitive loads.

The invention may be embodied in other forms without departing from the spirit or essential characteristics thereof. The embodiments disclosed in this application are to be considered in all respects as illustrative and not limitative, the scope of the invention is indicated by the appended claims rather than by the foregoing description, and all changes which come within the meaning and range of equivalency of the claims are intended to be embraced therein.

What is claimed is:

1. A driving circuit for a capacitive load comprising:

plural capacitive loads; and plural amplifiers corresponding to the plural capacitive loads for amplifying a voltage signal and supplying the amplified voltage signal to the corresponding capacitive load respectively;

wherein a charge accumulated in one capacitive load is used as an electric power supply source for another amplifier which is not an amplifier corresponding to the one capacitive load.

2. The driving circuit for a capacitive load according to claim 1, further comprising a switching part for switching the power supply source, wherein the switching part selects a charge accumulated in another capacitive load to be used as the power supply source in a predetermined period, a power supply source of the driving circuit is used as the power supply source in another, different period.

3. The driving circuit for a capacitive load according to claim 2, wherein the plural capacitive loads comprise a first capacitive load and a second capacitive load, the plural amplifiers comprise a first amplifier and a second amplifier, wherein voltage waveforms which have opposite phases and are amplified by the first and second amplifiers are applied to the first and second capacitive load respectively, the switching part selects the charge accumulated in the second capacitive load as a power supply source for the first amplifier during the period when the voltage of the first capacitive load is lower than that of the second capacitive load, in addition the voltage of the first capacitive load is rising and the voltage of the second capacitive load is descending, and the switching part selects the power supply source of the driving circuit as the power supply source for the first amplifier during another, different period.

4. The driving circuit for capacitive load according to claim 3, further comprising:

a first emitter follower circuit and a second emitter follower circuit for converting a voltage supplied from the supply voltage of the driving circuit to a voltage which is higher by a predetermined voltage than an output voltage of the first and the second amplifier, wherein a terminal of the power supply source of the first amplifier is connected to either an output of the emitter follower or the second capacitive load by the switching part using a diode.

* * * * *